US006944024B1

(12) United States Patent
Devine, III

(10) Patent No.: US 6,944,024 B1
(45) Date of Patent: Sep. 13, 2005

(54) HEAT SINK BRACKET FOR POWERED LOUDSPEAKER

(75) Inventor: William T. Devine, III, Freedom, NH (US)

(73) Assignee: Audioplex Technology Incorporated, Melvin Village, NH (US)

( * ) Notice: Subject to any disclaimer, the term of this patent is extended or adjusted under 35 U.S.C. 154(b) by 0 days.

(21) Appl. No.: 10/782,039

(22) Filed: Feb. 19, 2004

(51) Int. Cl.[7] .......... H05K 7/20

(52) U.S. Cl. .......... 361/704; 361/719; 165/80.3; 165/185; 381/397

(58) Field of Search .......... 361/688–690, 361/704, 719; 174/16.1, 16.3; 165/80.3, 165/185; 381/397

(56) References Cited

U.S. PATENT DOCUMENTS

| | | | | |
|---|---|---|---|---|
| 3,462,553 | A | 8/1969 | Spranger | |
| 3,778,551 | A | 12/1973 | Grodinsky | |
| 3,991,286 | A | 11/1976 | Hendricksen | |
| 4,210,778 | A | 7/1980 | Sakurai et al. | |
| 4,625,328 | A | 11/1986 | Freadman | |
| 4,757,547 | A | 7/1988 | Danley | |
| 4,811,403 | A | 3/1989 | Henricksen et al. | |
| 5,042,072 | A | 8/1991 | Button | |
| 5,357,586 | A | 10/1994 | Nordschow et al. | |
| 5,363,552 | A * | 11/1994 | Coniff | 29/840 |
| 5,426,707 | A | 6/1995 | Wijnker | |
| 5,533,132 | A | 7/1996 | Button | |
| 5,771,154 | A | 6/1998 | Goodman et al. | |
| 5,771,302 | A | 6/1998 | Schindler | |
| 5,909,015 | A | 6/1999 | Yamamoto et al. | |
| 5,940,522 | A | 8/1999 | Cahill et al. | |
| 5,991,424 | A | 11/1999 | Bertagni et al. | |
| 6,219,431 | B1 | 4/2001 | Proni | |
| 6,243,472 | B1 | 6/2001 | Bilan et al. | |
| 6,243,479 | B1 | 6/2001 | Proni | |
| 6,259,798 | B1 | 7/2001 | Perkins et al. | |
| 6,263,084 | B1 * | 7/2001 | Cressman et al. | 381/164 |
| 6,327,371 | B1 | 12/2001 | Proni | |
| 6,330,340 | B1 | 12/2001 | Proni | |
| 6,390,231 | B1 | 5/2002 | Howze | |
| 6,430,300 | B1 | 8/2002 | Cox et al. | |
| 6,549,637 | B1 | 4/2003 | Risch | |
| 6,563,711 | B1 * | 5/2003 | Daly et al. | 361/704 |
| 6,601,645 | B1 | 8/2003 | Abdo | |
| 2001/0031063 | A1 | 10/2001 | Langford et al. | |
| 2001/0055406 | A1 | 12/2001 | Geiger | |
| 2002/0094104 | A1 | 7/2002 | Bush | |
| 2002/0094105 | A1 | 7/2002 | Boniface | |
| 2003/0081808 | A1 | 5/2003 | Kemmerer | |
| 2003/0118207 | A1 | 6/2003 | Kudo | |
| 2004/0234077 | A1 * | 11/2004 | Ridley | 381/55 |

* cited by examiner

*Primary Examiner*—Boris Chèrvinsky
(74) *Attorney, Agent, or Firm*—McLane, Graf, Raulerson & Middleton, P.A.

(57) ABSTRACT

A combined heat sink and mounting bracket for a powered loudspeaker of a ported reflex type is provided. The combined heat sink and mounting bracket includes a base portion, a fastener attached to the base portion for securing to a reflex tube within the enclosure and a thermally conductive heat sink portion extending from the base portion. In further aspects, a loudspeaker assembly and an amplifier module incorporating the heat sink/mounting bracket are provided. In yet another aspect, a method of improving heat dissipation from an amplifier in a powered loudspeaker is also provided.

20 Claims, 5 Drawing Sheets

HEAT SINK BRACKET FOR POWERED LOUDSPEAKER

FIELD OF THE INVENTION

The present invention relates generally to audio speaker devices and more particularly to a heat sink apparatus for mounting electronic components within an audio speaker as well as methods, electronic assemblies, and loudspeakers employing the same.

BACKGROUND OF THE INVENTION

Powered audio speaker devices including on-board amplification circuitry for receiving, amplifying, and audibly reproducing an audio signal are used in connection with a variety audio applications, including home and studio audio systems, musical instrument amplification, public address systems, sound reinforcement, and the like.

Such devices generate significant thermal energy which, if not removed, may prevent proper functioning of the device or limit the lifetime of the device. Commonly, heat sinks are disposed so as to provide convective cooling with ambient air, e.g., by placement of the heat sink on an exterior surface of a speaker enclosure. While there are a number of devices which use a speaker cone as an air pump to provide air movement for cooling heat-producing components such as a speaker driver or power amplifier, such devices usually rely on a particular speaker or speaker enclosure design, such a specific speaker frame and/or speaker magnet assembly, or highly specialized speaker enclosure components, and cannot be adapted existing speakers or speaker designs. Therefore, it would be desirable to provide a heat dissipating mounting bracket which may be adapted for use in a variety of speakers or speaker designs without the need for a specialized speaker or enclosure.

Accordingly, the present invention contemplates a new and improved heat sink apparatus and method which overcome the above-referenced problems and others.

SUMMARY OF THE INVENTION

In a first aspect, a loudspeaker assembly includes an enclosure defining a speaker cavity and at least one speaker mounted in the enclosure. The enclosure has an opening formed in a surface thereof and a reflex tube extending from the opening into the speaker cavity, wherein the opening and reflex tube define a passageway for air movement in response to speaker movement. A combined heat sink and amplifier mounting bracket is secured to the reflex tube, the combined heat sink and amplifier mounting bracket including an amplifier mounting portion and a thermally conductive heat sink portion. The thermally conductive heat sink portion aligned with the reflex tube such that air moved in response to speaker movement passes over the heat sink portion.

In a second aspect, a combined heat sink and mounting bracket for a powered loudspeaker of a ported reflex type is provided. The combined heat sink and mounting bracket includes a base portion, a fastener attached to the base portion for securing to a reflex tube within the enclosure and a thermally conductive heat sink portion extending from the base portion.

In a third aspect, a combined heat sink and amplifier module for a powered loudspeaker includes a base portion and a fastener attached to the base portion for securing the combined heat sink and mounting bracket to the tube. A thermally conductive heat sink portion extends from the base portion and an amplifier is mounted to the base portion. The amplifier includes a heat-producing component, which is thermally coupled to the thermally conductive heat sink portion.

In a fourth aspect, a method for improving heat dissipation from an amplifier in a powered loudspeaker device includes positioning a combined heat sink and mounting bracket in the speaker cavity in alignment with the reflex tube and securing the combined heat sink and mounting bracket to the tube. An amplifier is mounted to the combined heat sink and mounting bracket, the amplifier being electrically coupled to the speaker. A heat producing component of the amplifier is thermally coupled to a heat sink portion of the combined heat sink and mounting bracket and the amplifier is operated to drive the speaker, wherein heat generated by the amplifier is transferred to the heat sink portion and wherein air movement through the reflex port exerts a cooling effect on the heat sink.

One advantage of the present invention resides in its ability to be adapted to a variety of ported reflex speakers or speaker enclosure designs, without reliance upon specialized speaker or speaker cabinet designs.

Still further advantages and benefits of the present invention will become apparent to those of ordinary skill in the art upon reading and understanding the following detailed description of the preferred embodiments.

BRIEF DESCRIPTION OF THE DRAWING

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
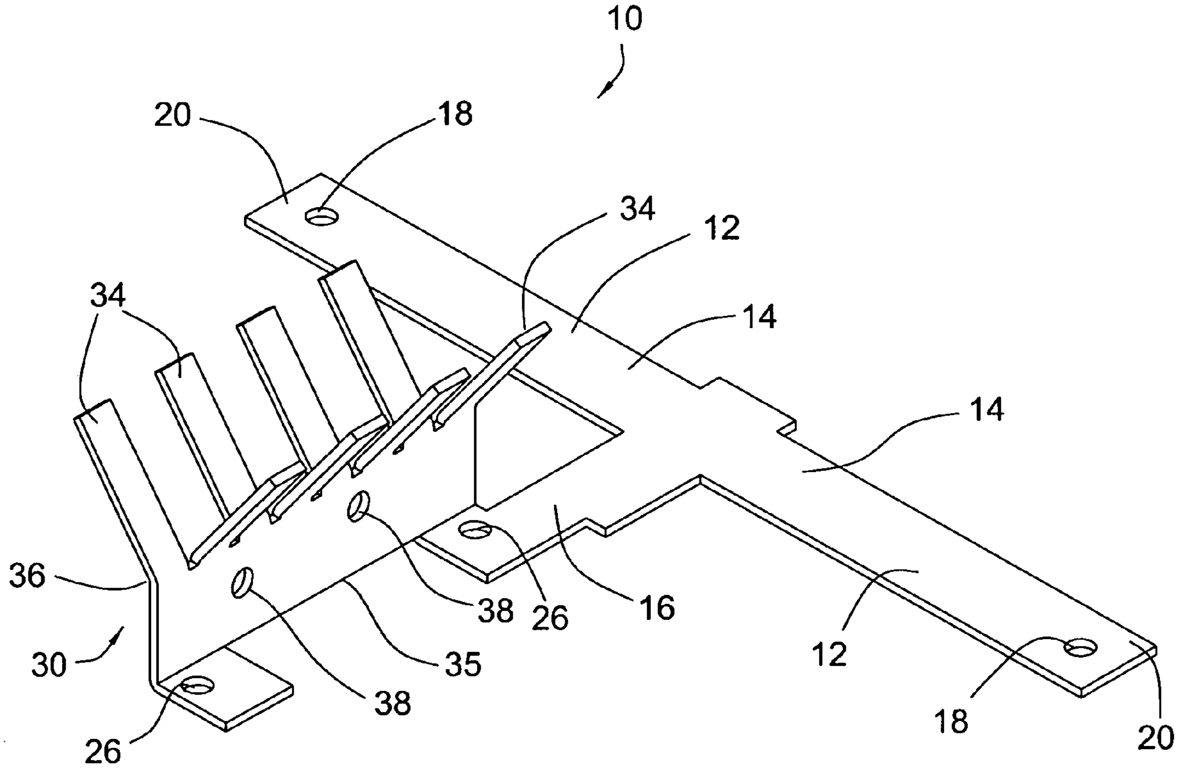
FIG. 1 is a perspective view of a heat sink and bracket according to an exemplary embodiment the present invention.
Figure 2:
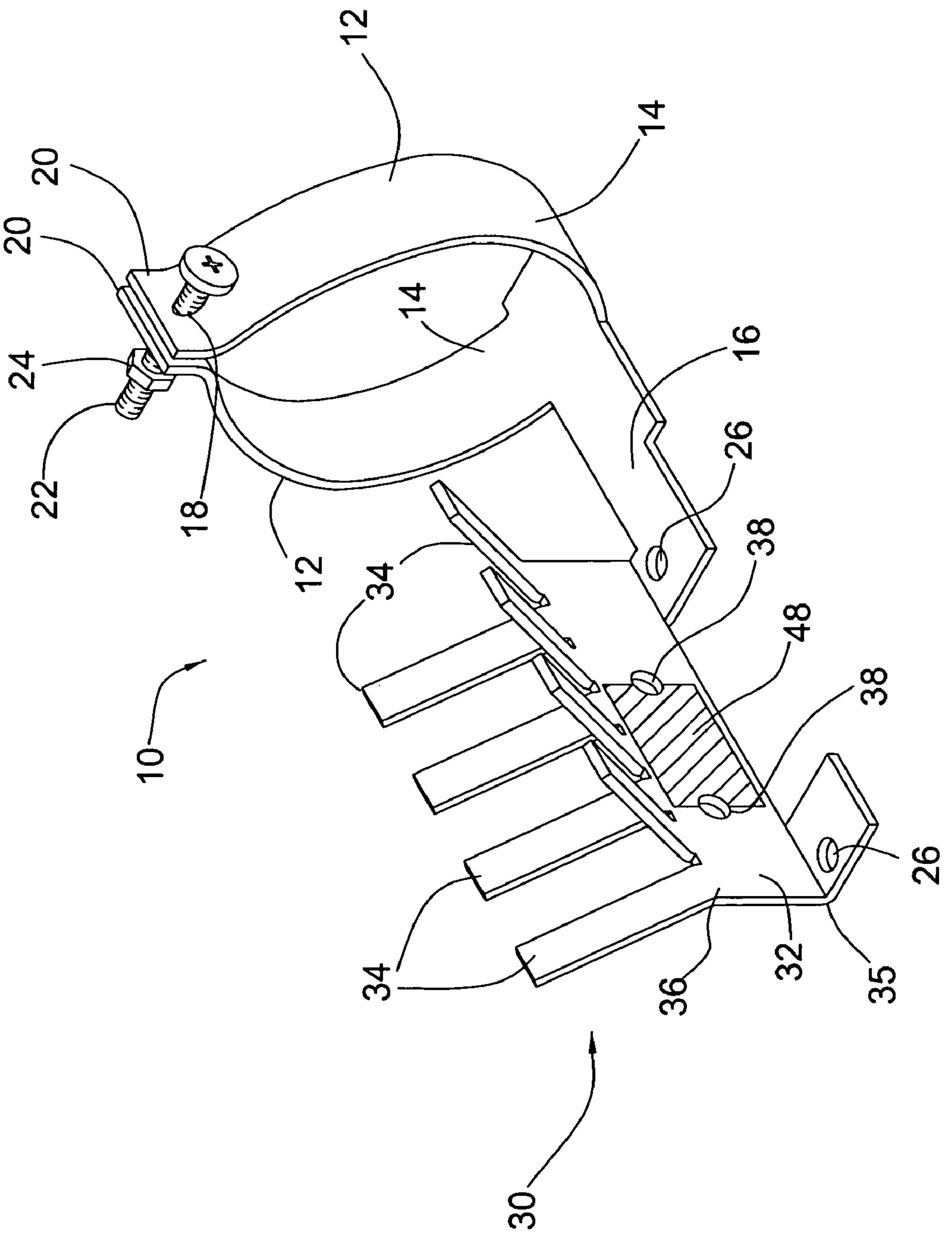
FIG. 2 is a perspective view of the heat sink and bracket shown in FIG. 1, wherein the clamping arms shown in a circumferential arrangement for clamping to a reflex port of a speaker.

Referring now to FIGS. 1 and 2, there appears an exemplary heat sink bracket 10 of the present invention. The heat sink bracket 10 includes mounting arms 12, which are sufficiently flexible or bendable so that they may be wrapped around a reflex port of a ported or reflex loudspeaker, while still providing secure retention of bracket 12 thereon. The embodiment of FIGS. 1 and 2 is adapted for use in connection with a loudspeaker having a ducted port cabinet or enclosure having at least one ducted port in which an opening 68 (see FIG. 5) is provided in the cabinet, typically the front, side or back, in conjunction with a tube or duct extending from the opening into the interior of the enclosure. Often, the tube is a straight tube of circular cross-sectional shape and the present invention will be shown and described primarily by way of reference thereto. However, other tube configurations and cross-sectional shapes, such as oval or elliptical, polygonal, etc., and/or other tube geometries are also contemplated.

The mounting arms 12 include proximal ends 14 proximate a base 16. Openings 18 near distal ends 20 of the mounting arms 12 receive a fastener for securing the arms 12 about a reflex port extending within a speaker enclosure. The fastener is depicted as a threaded connector 22, such as a bolt, screw, or the like, engaging an internally threaded member 24, such as a nut or the like (or internal threads within the opening 18), for securing the arms 12 and tightening the arms 12 about a reflex port. By selecting an appropriate length of the arms 12 and/or the position of the hole 18 placement thereon, the invention 10 may adapted for ports of any diameter. Likewise, a series of holes 18 may be placed along one or both of the arms 12 so that the unit may accommodate more than one port diameter.

The depicted embodiment includes clamping arms (12) connected by a threaded connector (22, 24), however, it will be recognized that other mechanical fastener types may be used in place thereof. Such alternative fasteners include but are not limited to one or more screws, clips, dogs, pawls, clamps, buckles, ties, bands, retaining rings, snap rings, adhesives, snap-fit, friction-fit, or sliding-fit members, sleeves, ties, bands, band clamps such as worm gear-tensioned or threaded rod-tensioned band clamps, spring-type or constant tension hose type clamps, and so forth. In still further embodiments, one or more features such as a mounting boss, threads, or other feature may be provided on the reflex tube for engaging a complimentary feature formed on the combined bracket and heat sink 10.

The base 16 extends from the distal ends 14 of the arms 12, in the inward direction relative to the opening 72 (see FIG. 5) when the unit is placed in its operative position and secured to a duct 70 (see FIG. 5) of a ducted port. The base 16 may include openings 26 for mounting an amplifier or associated circuit components. A heat sink portion 30 extends upwardly (in the orientation shown) from the base 16 and includes a thermally conductive plate member 32. The plate member 32 includes a lower edge 35 adjoining the base portion 16. The plate member 32 further includes an upper edge 36 having includes a series of fins or wings 34 extending therefrom. Openings 38 may be provided in the plate portion 32 to facilitate securing an amplifier in heat transfer relation thereto.

In the depicted embodiment, the fingers 34 are angled along the edge 36 with respect to the plate 32, with adjacent fingers 34 being angled toward opposite sides of the plate 32. It will be recognized that other configurations of the heat sink 30 are possible, and will depend on the heat dissipation requirements of the selected amplifier to be cooled. For example, the fins 34 may be omitted, wherein the heat sink portion constitutes a generally planar member. In other embodiments, the fingers 34 may be replaced with fins of alternative configuration disposed on one or more peripheral edges of the plate 32. In still further embodiments, a separately formed heat sink, may be thermally coupled to the thermally conductive plate 32, for example, to a surface of the conductive plate opposite the surface to which the amplifier contacts the plate 32. Examples of such heat sinks include, but are not limited to, extruded, stamped, cast, machined, folded fin, and bonded fin heat sinks, and so forth, having heat dissipating members in any of a variety of known configurations, including fins, channels, cross cut channels, fingers, pins, and the like.

Figure 5:
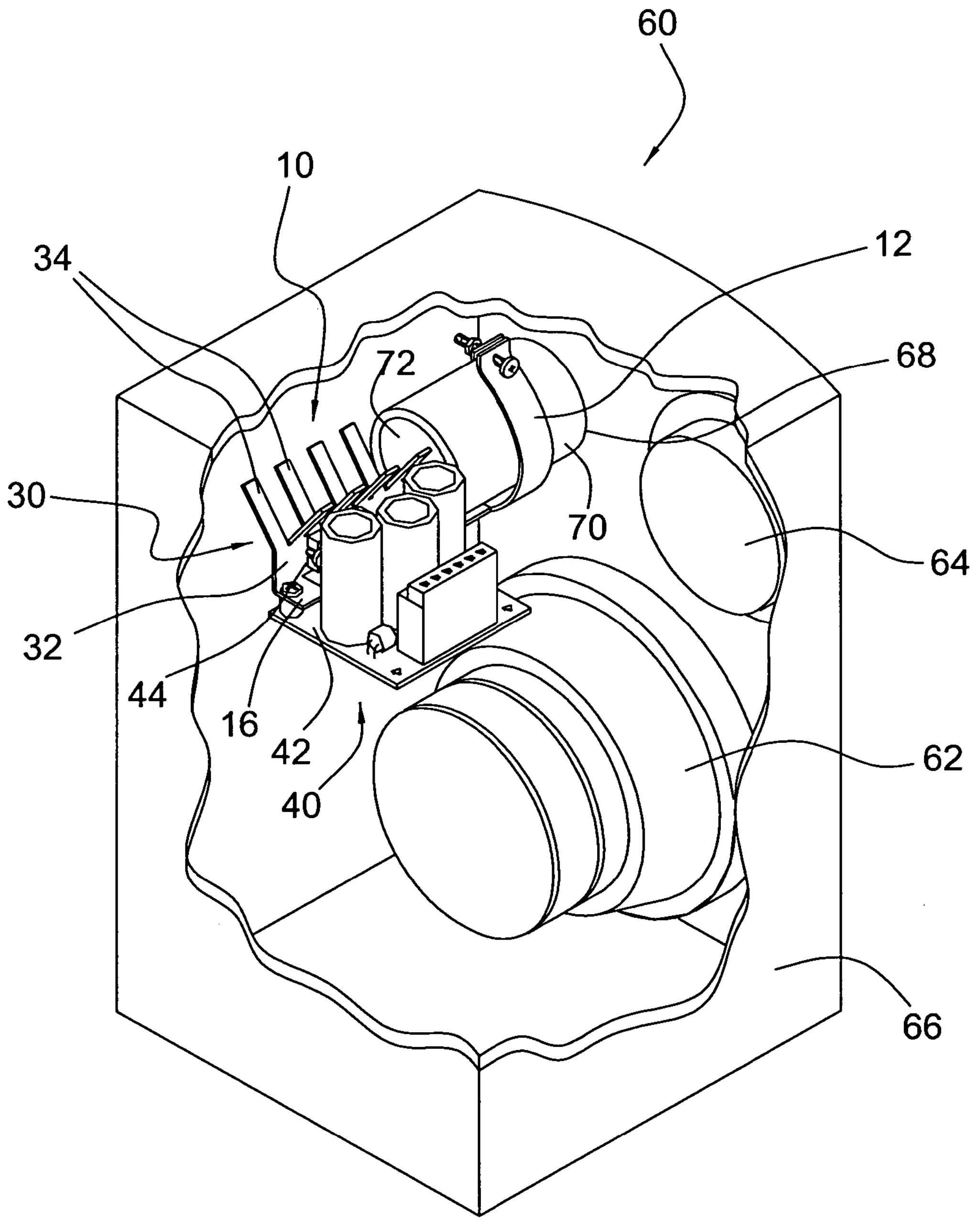
FIG. 5 is fragmentary view of an exemplary loudspeaker embodying the present invention.

The plate member is generally planar and, in operation, may be generally aligned with the axial direction of the speaker port. As best seen in the embodiment of FIG. 5, the heat sink portion 30 is positioned next to the opening 72 of the reflex duct 70 such that it is positioned within the air stream caused by movement of the speaker cone 62. Both the heat generated by the amplifier and the magnitude of speaker cone travel increase as the amplifier output is increased, thus moving a larger volume of air. In this manner, the cooling is self-regulating, being a function of amplifier output.

The heat sink portion 30, and preferably the entire bracket 10, may be formed from any thermally conductive material, such as a metal or metal alloy, preferably aluminum or an aluminum alloy. Other thermally conductive materials include copper or copper alloy, zinc or zinc alloy, beryllium or beryllium alloy, brass, stainless steel, and the like. The bracket 10 may be formed by first forming a flat, thermally conductive blank of desired outline followed by bending the shaped, flat blank to the final three-dimensional shape. The blank may be formed via casting, forging, stamping, cutting, machining, drilling, etc., and is preferably formed from a thermally conductive sheet material. The flat blank may then be bent along the lower and upper edges 35 and 36 to its final shape via an anvil, press, bending jig, or the like. The mounting arms 12 may be pre-bent to an approximate desired radius, or, may be bent by a user at the time of installation.

Figure 3:
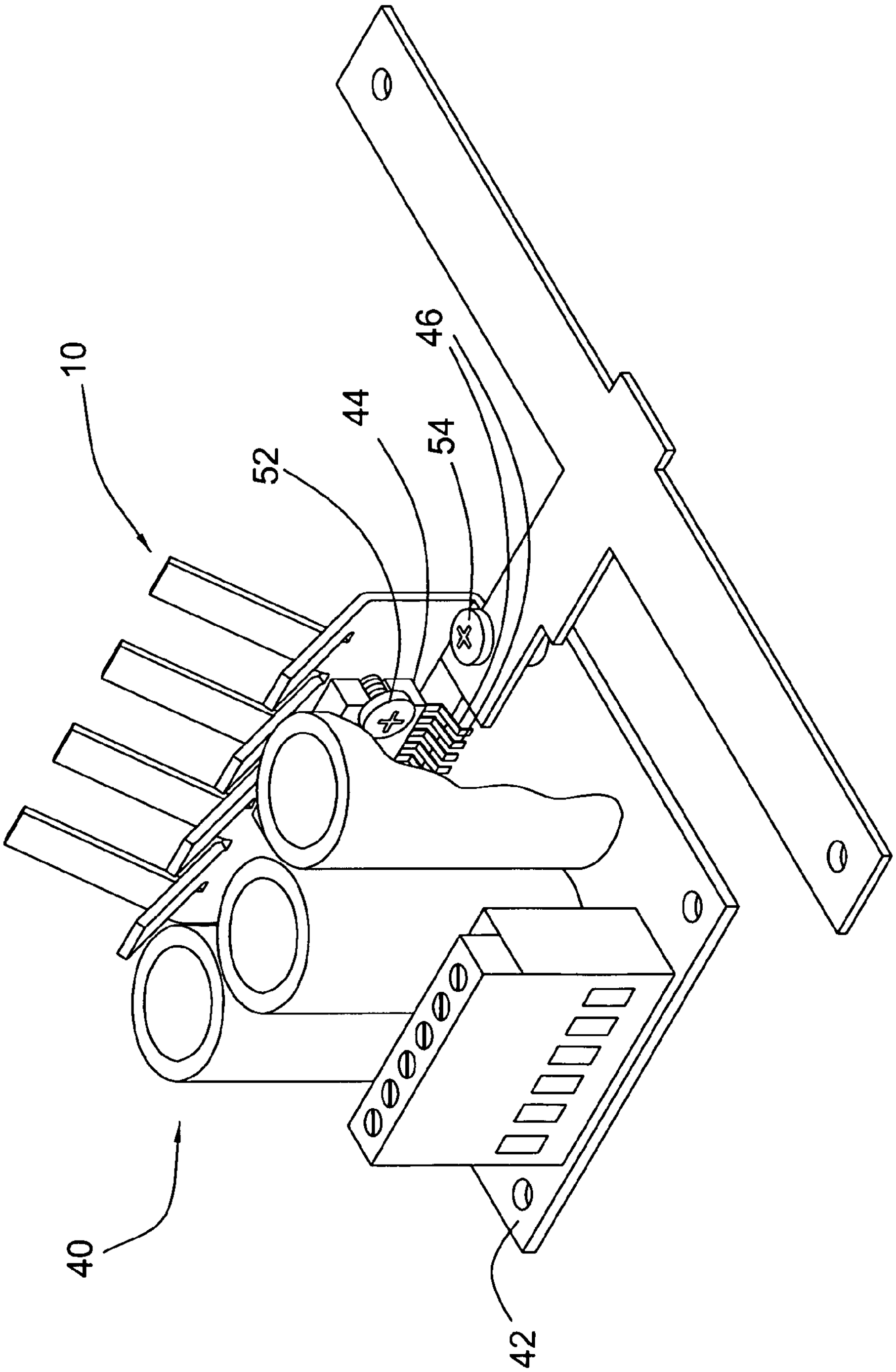
FIG. 3 is a front perspective view of an integrated amplifier and heat sink module according to an exemplary embodiment of the invention.
Figure 4:
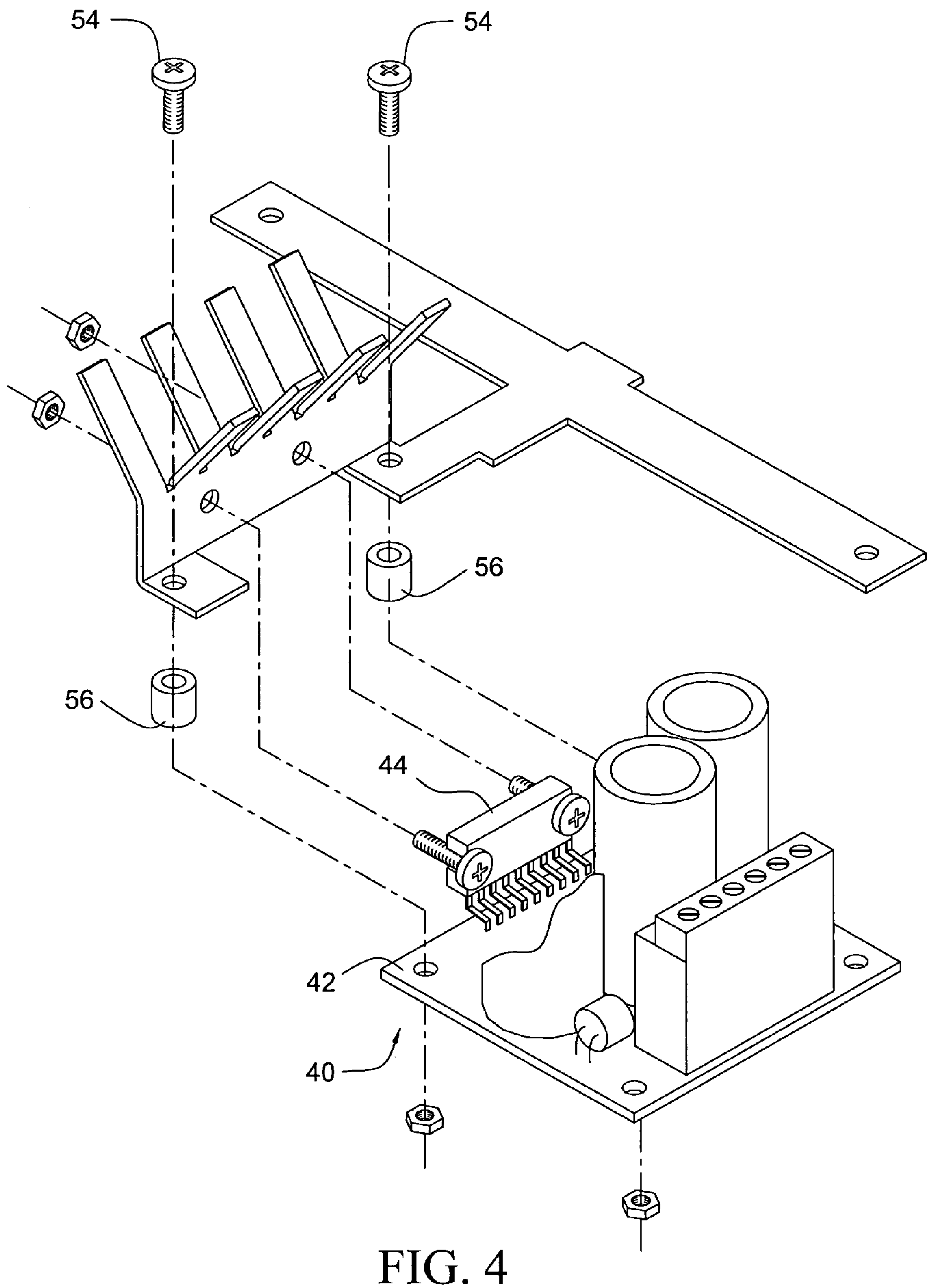
FIG. 4 is an exploded rear perspective view of the integrated amplifier and heat sink module shown in FIG. 3.

Referring now to FIGS. 3 and 4, there is shown an electronic assembly comprising a heat sink mounting bracket 10 having amplifier circuit or module 40 mounted thereto. The amplifier module includes a substrate 42, preferably a printed circuit board substrate, such as a conventional copper-clad fiberglass epoxy laminate, or the like. An amplifier circuit 44, which may be an integrated circuit package, is electrically coupled to the substrate, and any additional circuit components carried thereon, via lead wires 46.

In the depicted embodiment, the substrate 42 may carry additional circuit components, such as power supply connectors, terminal connectors, fuses or other overload protection, and the like. It will be recognized, however, that components such as these and others may be mounted elsewhere in the speaker enclosure and/or may be omitted, depending on the speaker design or component types employed.

The amplifier circuit 44 is in thermal contact with the plate member 32 of the heat sink 30, which acts to remove heat from the amplifier device 44. As used herein, the term heat sink is understood to include not only the heat removing device itself, but also any optional thermal compound or material 48 (see FIG. 2) interfacing with the amplifier 44 to effect efficient thermal transfer. Such thermal compounds may include, for example, thermal grease, thermal tape, thermal pads, thermal film, thermal epoxy, phase change thermal interface materials, and the like. Commonly, high-powered semiconductor devices or packaging contain a thermally conductive side or surface 50, which is placed in contact with the plate member 32. One or more threaded fasteners/screws 52 or other suitable affixing mechanisms, such as one or more clips, clamps, dogs, pawls, or the like, may be used to provide positive mechanical pressure between the amplifier package 44 and the heat sink plate member 32, thereby providing firm thermal contact therebetween.

In the illustrated example, the substrate 42 is secured to the base portion 16 of the heat sink 10, via threaded fasteners screws 54 or other suitable affixing mechanism. Spacers 56 may also be provided, for example, to prevent an over-tightening of the screws 54 or damaging the circuit board 42. In the illustrated example, the spacers are formed of an insulating material to prevent inadvertent grounding of the amplifier 44. Additional holes may provided to accommodate amplifiers and/or circuit boards of different sizes, shapes, or hole patterns.

Although the illustrated embodiment depicts an integrated circuit amplifier package 44, it will be recognized that the heat sink bracket 10 of the present invention may also be employed in connection with an amplifier having discrete circuit components. For example, an amplifier circuit having one or more discrete power transistors may be employed. If employed, such power transistors may also be thermally coupled to the plate member 32 in the same manner as described above.

Referring now to FIG. 5, an exemplary loudspeaker 60 of the ported reflex type includes a first speaker 62 and a second speaker 64, mounted within a ported enclosure 66. The ported enclosure 66 includes an opening 68 therethrough and a tube or duct 70 extending inwardly into the enclosure 66 therefrom. The duct terminates in an opening 72 opposite the opening 68. A heat sink bracket 10 is clamped to the port 70 via clamping arms 12 as described above. The heat sink bracket 10 carries an amplifier module 40, including a circuit board 42 affixed to the base portion 16 of the bracket 10, with an amplifier 44 being in thermal communication with thermally conductive plate 32 of a heat sink portion 30 of the bracket 10. Fins 34 extend from the plate 32. The heat sink portion 30 comprising the plate 32 and the fins 34 and is axially aligned with the tube 70 and positioned near the tube opening 72 such that air movement through the port 70 in response to movement of the speaker 62 will provide cooling of the heat sink 30.

In the depicted embodiment, loudspeaker 60 is depicted as a two-way speaker system wherein the speaker 62 is a cone woofer designed to reproduce a lower frequency range and the speaker 64 is a tweeter for reproducing an upper frequency range.

It will be recognized that the present invention may be employed in connection with all manner of loudspeaker designs and speaker types, including any one or more electrodynamic speakers, electrostatic speakers, piezoelectric speakers, woofers, subwoofers, midrange speakers, tweeters, passive radiators, and so forth, or any combination thereof.

Additionally, it will be recognized that the loudspeaker may powered via an external power source, e.g., AC mains, generator, an electrical system of a vehicle, etc., or, via a self-contained power source, such as an internal battery or battery pack.

In a preferred embodiment, the loudspeaker 60 receives an analog audio signal via a cabled connection to an audio source and utilizes an analog audio amplifier. In alternative embodiments, a loudspeaker including a wireless receiver for receiving an audio signal modulated on a carrier wave (e.g., radio frequency, infrared, etc.) is also contemplated.

It will be recognized that any combination of an analog or digital input signal and an analog or digital amplifier may be employed. For example, the loudspeaker 60 may include an analog-to-digital converter for receiving an analog audio signal and a digital signal processor to provide digital filtering and/or other digital processing techniques for providing control over audio signals. For example, digital signal processing may be utilized in lieu of traditional analog crossover networks to separate audio signals into low frequency and high frequency bands.

In certain embodiments, a digital amplifier may be provided for receiving digital audio data, e.g., directly from a digital storage medium or source, via streaming data containing digital audio data, or from an analog audio source using an analog-to-digital converter.

Similarly, a digital-to-analog converter may be provided for receiving a digital or digitally processed signal and outputting an analog signal to an analog amplifier.

Likewise, the use of multiple or multichannel amplifiers are also contemplated. For example, a multiple channel amplifier (or multiple amplifiers) may be employed for biamplified or triamplified systems, e.g., wherein different frequency bands are separately amplified. Also, a multichannel amplifier (or multiple amplifiers) may be provided to receive and separately amplify individual channels of a multichannel audio signal. For example, a pair of loudspeakers may be provided for audibly reproducing a stereophonic audio signal wherein one of the loudspeakers is powered and the other is not. In this manner, both channels are amplified by the powered loudspeaker and one of the channels is output to the nonpowered loudspeaker.

The invention has been described with reference to the preferred embodiments. Modifications and alterations will occur to others upon a reading and understanding of the preceding detailed description. It is intended that the invention be construed as including all such modifications and alterations insofar as they come within the scope of the appended claims or the equivalents thereof.

Having thus described the preferred embodiments, the invention is now claimed to be:

1. A loudspeaker assembly, comprising:

an enclosure defining a speaker cavity;

at least one speaker mounted to said enclosure;

said enclosure having an opening formed in a surface thereof and a reflex tube extending from said opening into said speaker cavity, said opening and reflex tube defining a passageway for air movement in response to speaker movement;

a combined heat sink and amplifier mounting bracket secured to said reflex tube, said combined heat sink and amplifier mounting bracket including an amplifier mounting portion and a thermally conductive heat sink portion, said thermally conductive heat sink portion aligned with said reflex tube such that air moved in response to speaker movement passes over said heat sink portion.

2. The loudspeaker assembly of claim 1, further comprising:

an amplifier mounted to said amplifier mounting portion and thermally coupled to said thermally conductive heat sink portion.

3. The loudspeaker assembly of claim 1, wherein said heat sink portion includes a thermally conductive plate member and a plurality of thermally conductive fins extending from and in thermal communication with said thermally conductive plate member.

4. The loudspeaker assembly of claim 3, wherein said plate member and said fins are integrally formed of a thermally conductive material.

5. The loudspeaker assembly of claim 3, further comprising:

an amplifier mounted to said amplifier mounting portion; and said amplifier including a heat-producing component, the heat-producing component thermally coupled to said thermally conductive plate member.

6. The loudspeaker assembly of claim 5, wherein said amplifier includes a circuit board and a power amplifier semiconductor device electrically coupled to said circuit board.

7. The loudspeaker of claim 6, further comprising one or both of:

at least one fastener for attaching said circuit board to said amplifier mounting portion; and at least one fastener for maintaining thermal communication between said power amplifier semiconductor device and said conductive plate member.

8. A combined heat sink and mounting bracket for a powered loudspeaker of a type having an enclosure, a reflex port formed on the enclosure, the reflex port defined by an opening on a surface of the enclosure and a tube extending from the opening into an interior of the enclosure, the combined heat sink and mounting bracket comprising:

a base portion;

a fastener attached to the base portion for securing the combined heat sink and mounting bracket to said tube; and a thermally conductive heat sink portion extending from the base portion.

9. The combined heat sink and mounting bracket of claim 8, further comprising:

one or more openings formed in the base portion for mounting a circuit board carrying an amplifier circuit.

10. The combined heat sink and mounting bracket of claim 8, further comprising:

one or more openings formed in the heat sink portion for affixing an amplifier in thermal communication with said thermally conductive heat sink portion.

11. The combined heat sink and mounting bracket of claim 8, wherein said heat sink portion includes a thermally conductive plate member and a plurality of thermally conductive fins extending from and in thermal communication with said thermally conductive plate member.

12. The combined heat sink and mounting bracket of claim 11, wherein said plate member and said fins are integrally formed of a thermally conductive material.

13. The combined heat sink and mounting bracket of claim 11, wherein said base portion, fastener, plate member, and fins are integrally formed of a thermally conductive material.

14. The combined heat sink and mounting bracket of claim 13, wherein said thermally conductive material is a sheet of material formed of a metal or metal alloy.

15. The combined heat sink and mounting bracket of claim 13, wherein the thermally conductive material is selected from the group consisting of aluminum, aluminum alloys, copper, copper alloys, zinc, zinc alloys, beryllium, beryllium alloys, brass, and stainless steel.

16. A combined heat sink and amplifier module for a powered loudspeaker of a type having an enclosure, a reflex port formed on the enclosure, the reflex port defined by an opening on a surface of the enclosure and a tube extending from the opening into an interior of the enclosure, the combined heat sink and mounting bracket comprising:

a base portion;

a fastener attached to the base portion for securing the combined heat sink and mounting bracket to said tube;

a thermally conductive heat sink portion extending from the base portion;

an amplifier mounted to the base portion; and said amplifier including a heat-producing component, the heat-producing component thermally coupled to said thermally conductive heat sink portion.

17. The combined heat sink and amplifier module of claim 16, wherein said amplifier includes a circuit board and a power amplifier semiconductor device electrically coupled to said circuit board.

18. The combined heat sink and amplifier module of claim 17, further comprising one or both of:

at least one fastener for attaching said circuit board to said amplifier mounting portion; and at least one fastener for maintaining thermal contact between said power amplifier semiconductor device and said conductive heat sink portion.

19. The combined heat sink and amplifier module of claim 17, further comprising a thermal compound disposed between said heat-producing component and said thermally conductive heat sink portion.

20. A method for improving heat dissipation from an amplifier in a powered loudspeaker device, the loudspeaker device of a type having an enclosure defining a speaker cavity, at least one speaker mounted to said enclosure, said enclosure having an opening formed in a surface thereof and a reflex tube extending from said opening into said speaker cavity, said opening and reflex tube defining a passageway for air movement in response to speaker movement, the method comprising:

positioning a combined heat sink and mounting bracket in said speaker cavity in alignment with said reflex tube;

securing the combined heat sink and mounting bracket to said tube;

mounting an amplifier to said combined heat sink and mounting bracket, said amplifier electrically coupled to said speaker;

thermally coupling a heat producing component of said amplifier to a heat sink portion of said combined heat sink and mounting bracket;

operating said amplifier to drive said speaker, wherein heat generated by said amplifier is transferred to said heat sink portion and wherein air movement through said reflex port exerts a cooling effect on said heat sink.

* * * * *